(12) United States Patent
Hsiao

(10) Patent No.: US 7,808,060 B2
(45) Date of Patent: Oct. 5, 2010

(54) MEMS MICROPHONE MODULE AND METHOD THEREOF

(75) Inventor: Wei-Min Hsiao, Kao-Hsiung (TW)

(73) Assignee: Advanced Semiconductor Engineering, Inc., Kao-Hsiung (TW)

( * ) Notice: Subject to any disclaimer, the term of this patent is extended or adjusted under 35 U.S.C. 154(b) by 433 days.

(21) Appl. No.: 11/943,597

(22) Filed: Nov. 21, 2007

(65) Prior Publication Data

US 2008/0157238 A1   Jul. 3, 2008

(30) Foreign Application Priority Data

Dec. 29, 2006   (TW) .............................. 95149878 A

(51) Int. Cl.
*H01L 29/78* (2006.01)
(52) U.S. Cl. .......................... 257/416; 438/53; 438/50; 257/254; 257/686; 257/E25.006; 257/E25.013
(58) Field of Classification Search ............... 438/53, 438/50; 257/254, 416, 686, E25.006, E25.013
See application file for complete search history.

(56) References Cited

U.S. PATENT DOCUMENTS

| 6,178,249 | B1 * | 1/2001 | Hietanen et al. | 381/174 |
| 2004/0253760 | A1 * | 12/2004 | Zhang et al. | 438/53 |
| 2005/0179100 | A1 * | 8/2005 | Barzen et al. | 257/415 |
| 2005/0189635 | A1 * | 9/2005 | Humpston et al. | 257/678 |
| 2005/0207605 | A1 * | 9/2005 | Dehe et al. | 381/369 |
| 2007/0105304 | A1 * | 5/2007 | Kasai et al. | 438/254 |

* cited by examiner

*Primary Examiner*—N Drew Richards
*Assistant Examiner*—Yu-Hsi Sun
(74) *Attorney, Agent, or Firm*—Winston Hsu; Scott Margo; Min-Lee Teng

(57) ABSTRACT

A MEMS microphone module having an application specific IC and a microphone chip is disclosed. The application specific IC has a plurality of first vias and a plurality of first pads, and the first vias are connected to the first pads. The microphone chip has a resonant cavity, a plurality of second vias and a plurality of second pads, and the second vias are connected to the second pads. The microphone chip is disposed on a first surface of the application specific IC with an opening of the resonant cavity facing toward a first surface of the application specific IC. The second conductive vias of the microphone chip are also electrically connected to the first vias of the application specific IC. By placing the microphone chip on the first surface of the application specific IC, the present invention could reduce the package size and increase the reliability of the package.

10 Claims, 11 Drawing Sheets

MEMS MICROPHONE MODULE AND METHOD THEREOF

BACKGROUND OF THE INVENTION

1. Field of the Invention

The present invention relates to a MEMS microphone module, and more particularly, to a MEMS microphone module having a fabrication process capable of eliminating wire bonding and die bonding processes.

2. Description of the Prior Art

As fabrication for semiconductor devices and micro-electromechanical systems advances, the size and volume of microphone modules also proceeds toward a direction of miniaturization. In conventional packaging processes for a microphone module, microphone chips and signal conversion chips are placed on a substrate and bonding wires are formed to connect the microphone chip, the signal conversion chip, and the substrate. Unfortunately, the utilization of bonding wires often creates a longer path for signal transmission and reduces the transmission speed for the device, and the prolonged fabrication time for this type of modules also increases the overall fabrication cost. Typically, the cover of the microphone module is fabricated with a height higher than the bonding wires, which further increases the difficulty for achieving a miniaturized microphone module.

SUMMARY OF THE INVENTION

It is an objective of the present invention to provide a MEMS microphone module and fabricating method thereof.

A MEMS microphone module having an application specific IC and a microphone chip is disclosed. The application specific IC has a plurality of first vias and a plurality of first pads, and the first vias are connected to the first pads. The microphone chip has a resonant cavity, a plurality of second vias and a plurality of second pads, in which the second vias are connected to the second pads. The microphone chip is disposed on a first surface of the application specific IC with an opening of the resonant cavity facing toward a first surface of the application specific IC. The second conductive vias of the microphone chip are also electrically connected to the first vias of the application specific IC. By placing the microphone chip on the first surface of the application specific IC, the present invention could reduce the package size and increase the reliability of the package significantly. Moreover, by electrically connecting the application specific IC and the microphone chip through the first vias and the second vias, the present invention could omit conventional wire bonding and die bonding processes to reduce the overall operation time and increase yield.

According to another aspect of the present invention, a method for fabricating a MEMS microphone module is disclosed. The method includes the following steps: providing a first wafer having a plurality of application specific IC, wherein each of the application specific IC comprises a first surface, a second surface, a plurality of first pads formed on the first surface, and a plurality of first vias connecting the first pads; providing a second wafer having a plurality of microphone chips, wherein each of the microphone chips comprises an active surface, a back surface, a resonant cavity having an opening formed on the back surface of the microphone chip, a vibrating film and a plurality of second pads formed on the active surface of the microphone chip, and a plurality of second vias connected to the second pads; and performing a bonding process to bond the second wafer and the first wafer by connecting the microphone chips of the second wafer to the application specific IC of the first wafer, wherein the opening of the resonant cavity is disposed to face toward the application specific IC and the first vias of the application specific IC are electrically connected to the second vias of the microphone chip.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
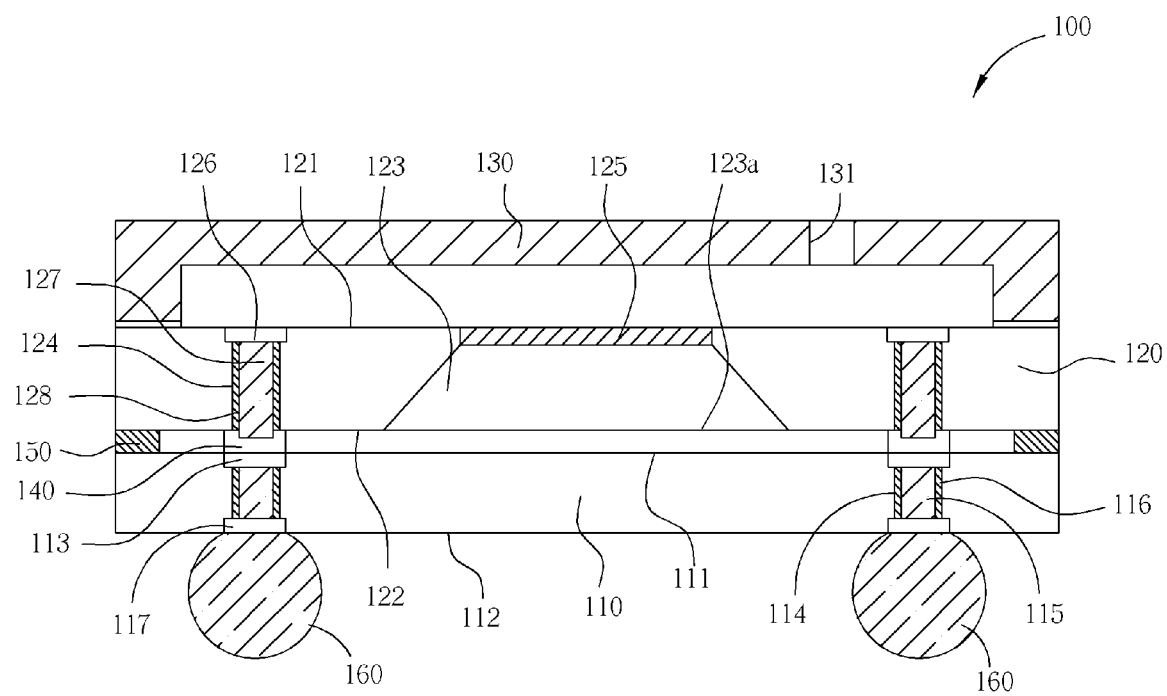
FIG. 1 illustrates a cross-section of a MEMS microphone module according to a first embodiment of the present invention.

Referring to FIG. 1, FIG. 1 illustrates a MEMS microphone module 100 according to a first embodiment of the present invention. The MEMS microphone module 100 includes an application specific IC 110, a microphone chip 120, and a cover 130. The application specific IC 110 has a first surface 111, a second surface 112, a plurality of first pads 113, and a plurality of first vias 114. The first pads 113 are formed on the first surface 111 of the application specific IC 110, and the first vias 114 connected to the first pads 113 are formed to communicate with the first surface 111 and the second surface 112.

The microphone chip 120 has an active surface 121, a back surface 122, a resonant cavity 123, a plurality of second vias 124, a vibrating film 125, and a plurality of second pads 126. The resonant cavity 123 and the second vias 124 are formed on the back surface 122 of the microphone chip 120, in which the resonant cavity 123 includes an opening 123a. The vibrating film 125 and the second pads 126 are formed on the active surface 121, the vibrating film 125 is disposed corresponding to the resonant cavity 123, and the second vias 124 are connected to the second pads 126. The microphone chip 120 is disposed on the first surface 111 of the application specific IC 110 with the opening 123a of the resonant cavity 123 facing toward the application specific IC 110, in which the first vias 114 of the application specific IC 110 are electrically connected to the second vias 124 of the microphone chip 120.

In this embodiment, the application specific IC 110 also includes a first metal 115 formed in the first vias 114 and an insulator 116 formed between the first vias 114 and the first metal 115 to prevent short circuit. The microphone chip 120 also includes a second metal 127 and a second insulator 128 accordingly. The second metal 127 protrudes from the back surface 122 of the microphone chip 120 is formed in the second vias 124, and the second insulator 128 is formed between the second vias 124 and the second metal 127 to prevent short circuit. In this embodiment, the MEMS microphone module 100 further includes a sealing layer 140 formed between the application specific IC 110 and the microphone chip 120. The sealing layer 140 can be utilized to establish an electrical connection between the first vias 114 and the second vias 124. The sealing layer 140 is preferably composed of an anisotropic conductive film or an anisotropic conductive paste. In another embodiment of the present invention, when the microphone chip 120 and the application specific IC 110 are bonded through eutectic bonding, the sealing layer 140 utilized can be composed of a non-conductive film or a non-conductive paste.

The cover 130 is disposed on the active surface 121 of the microphone chip 120, in which the cover 130 includes at least one sound hole 131. In this embodiment, the cover 130 is fabricated with a "U" shaped cross-section to protect the microphone chip 120 and the vibrating film 125. The MEMS microphone module 100 also has an encapsulant 150 formed between the application specific IC 110 and the microphone chip 120. The encapsulant 150 is preferably disposed with respect to the exterior side of the first vias 114 of the application specific IC 110 and the second vias 124 of the microphone chip 120. The encapsulant 150 could be fabricated with an "○" shape, a "□" shape, or other shapes composed of sealed-rings. The encapsulant 150 could be formed on the back surface 122 of the microphone chip 120, on the first surface 111 of the application specific IC 110, or on both the back surface 122 of the microphone chip 120 and the first surface 111 of the application specific IC 110, which are all within the scope of the present invention. In this embodiment, the encapsulant 150 is fabricated with a metal material to enhance the sealing ability for the module.

Referring back to FIG. 1, a plurality of external pads 117 is formed on the second surface 112 of the application specific IC 110 while connecting the first vias 114. The microphone module 100 further includes a plurality of solder balls 160 connected to the external pads 117. As the microphone chip 120 is directly bonded to the first surface 111 of the application specific IC 110 with a surface mounting technique, the MEMS microphone module 100 would have a much smaller package size and stronger reliability. Additionally, by electrically connecting the first vias 114 of the application specific IC 110 to the second vias 124 of the microphone chip 120, the present invention also eliminates the need for performing traditional wire bonding and die bonding processes, which not only reduces operating time and increases production rate, but also shortens transmission paths for the module for increasing overall transmission speed.

Figure 2:
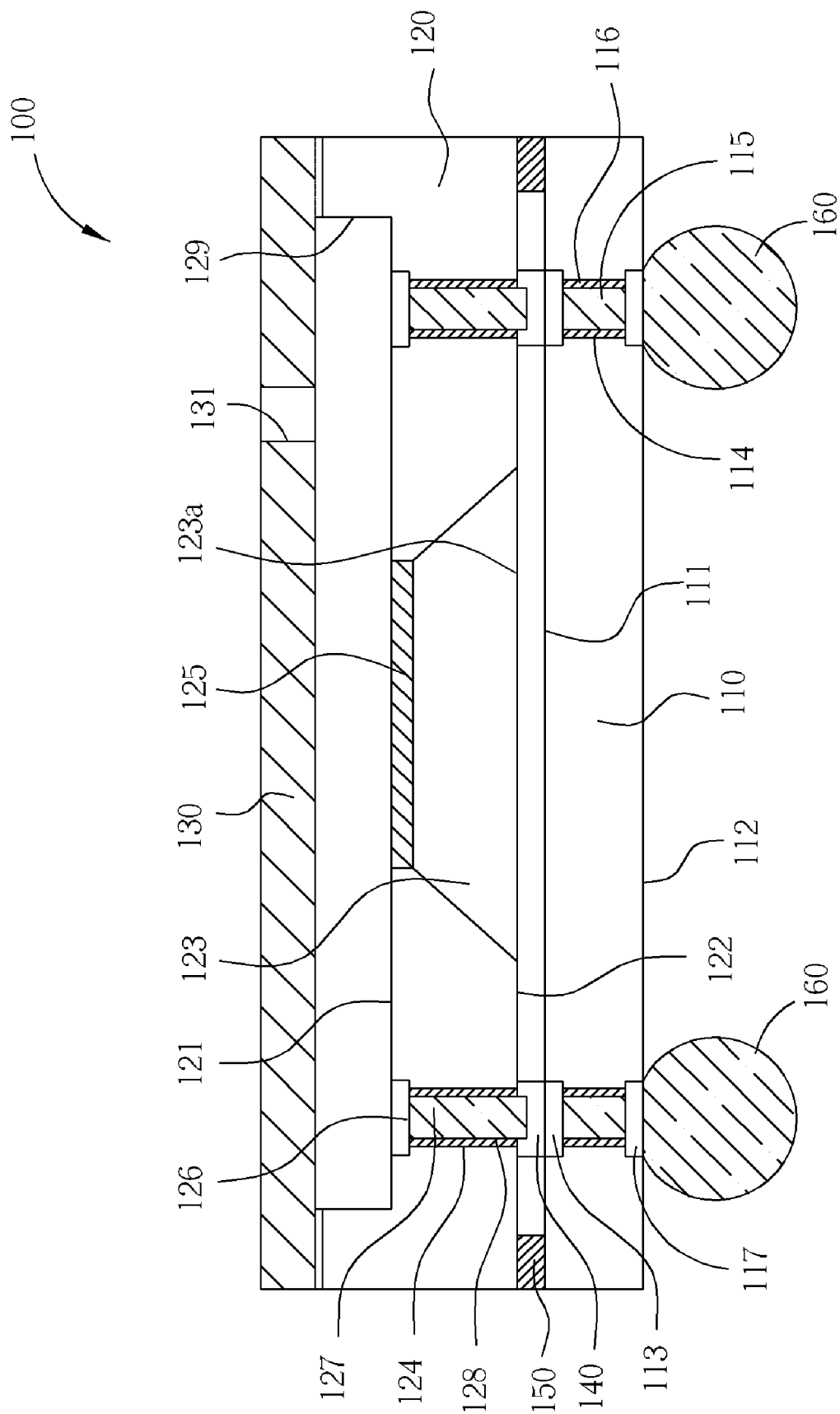
FIG. 2 illustrates a cross-section of a MEMS microphone module according to a second embodiment of the present invention.

Referring to FIG. 2, FIG. 2 illustrates a cross-section of a MEMS microphone module according to another embodiment of the present invention. As shown in FIG. 2, a surrounding wall 129 is formed on the active surface 121 of the microphone chip 120, and the cover 130 is disposed on the surrounding wall 129. In this embodiment, the cover 130 is fabricated with a "-" shaped cross-section.

Figure 3A:
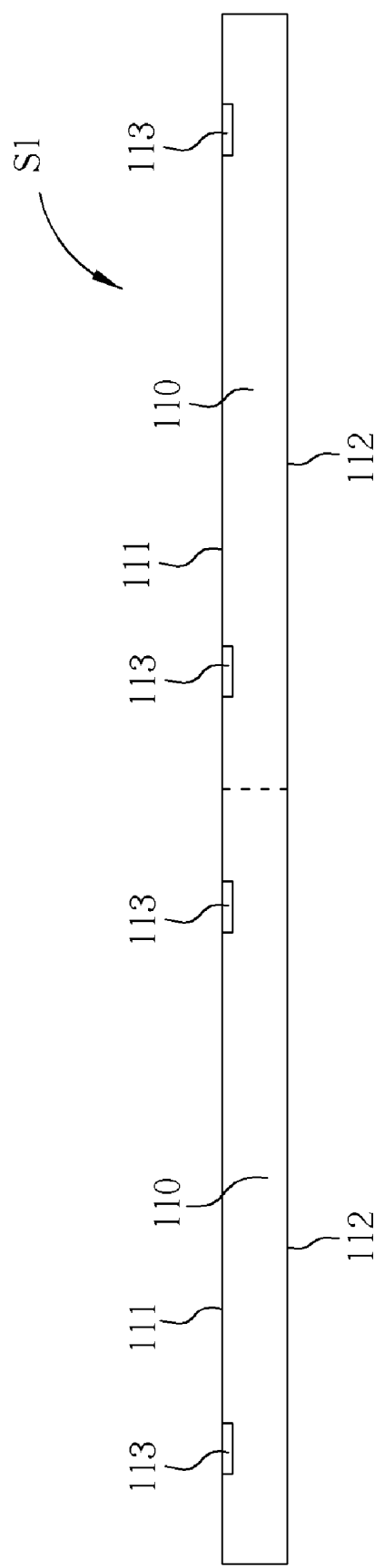
FIG. 3A-3I illustrate a cross-section view for fabricating a MEMS microphone module according to the first embodiment of the present invention.
Figure 3B:
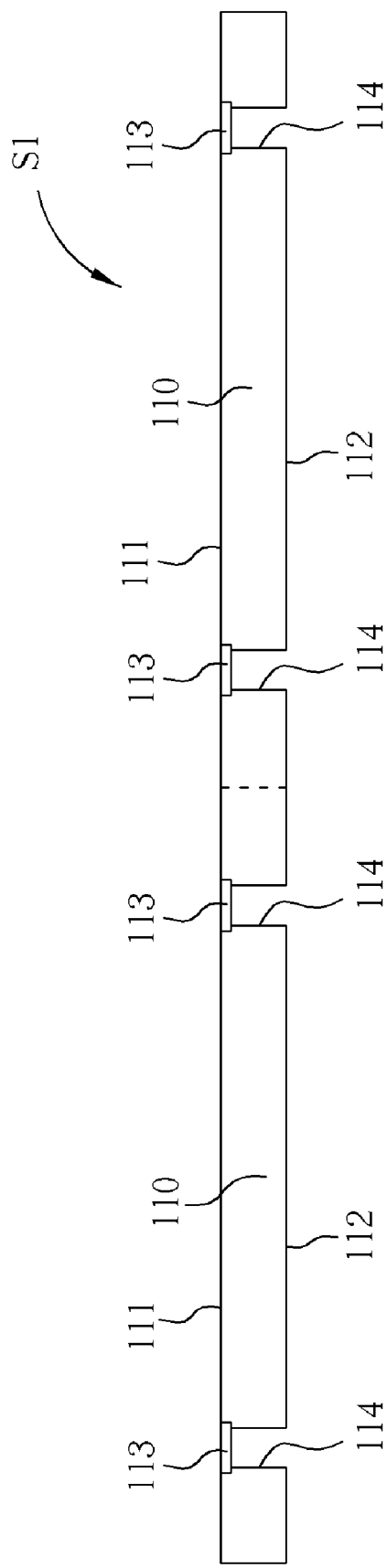
Figure 3C:
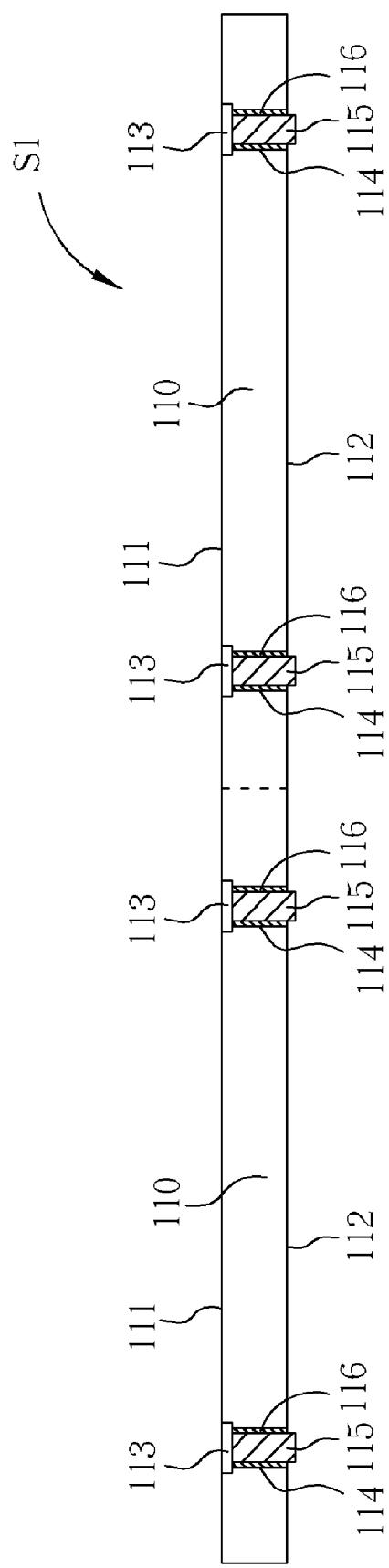
Figure 3D:
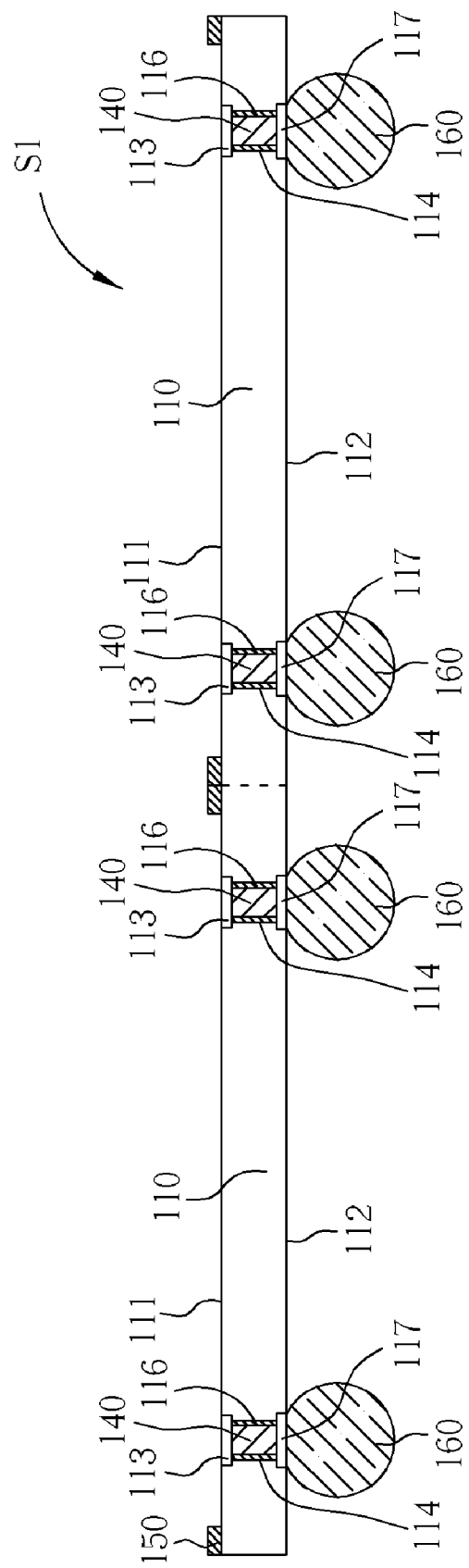

Referring to FIGS. 3A-3I, FIGS. 3A-3I illustrate a method for fabricating the MEMS microphone module 100 according to an embodiment of the present invention. As shown in FIG. 3A, a first wafer S1 having a plurality of application specific IC 110 is provided. Each of the application specific IC 110 has a first surface 111, a second surface 112, and a plurality of first pads 113 formed on the first surface 111. Next, as shown in FIG. 3B, a plurality of first vias 114 connected to the first pads 113 is formed on the second surface 112 of the application specific IC 110. In this embodiment, the first vias 114 are formed by an etching process. Next, as shown in FIG. 3C, a first metal 115 and an insulator 116 are deposited in the first vias 114 of the application specific IC 110. The first insulator 116 is formed between the inner wall of the first vias 114 and the first metal 115 to prevent short circuit, and the first metal 115 is formed to protrude from the second surface 112 of the application specific IC 110. The first metal 115 is preferably formed by a sputtering or electroplating process, and the first insulator 116 is preferably formed by a chemical vapor deposition process. Next, as shown in FIG. 3D, a plurality of external pads 117 is formed on the second surface 112 of the application specific IC 110, and an encapsulant 150 is formed on the first surface 111 of the application specific IC 110. In this embodiment, the encapsulant 150 is disposed with respect to the exterior side of the first vias 114, and a plurality of solder balls 160 is bonded to the external pads 117.

Figure 3E:
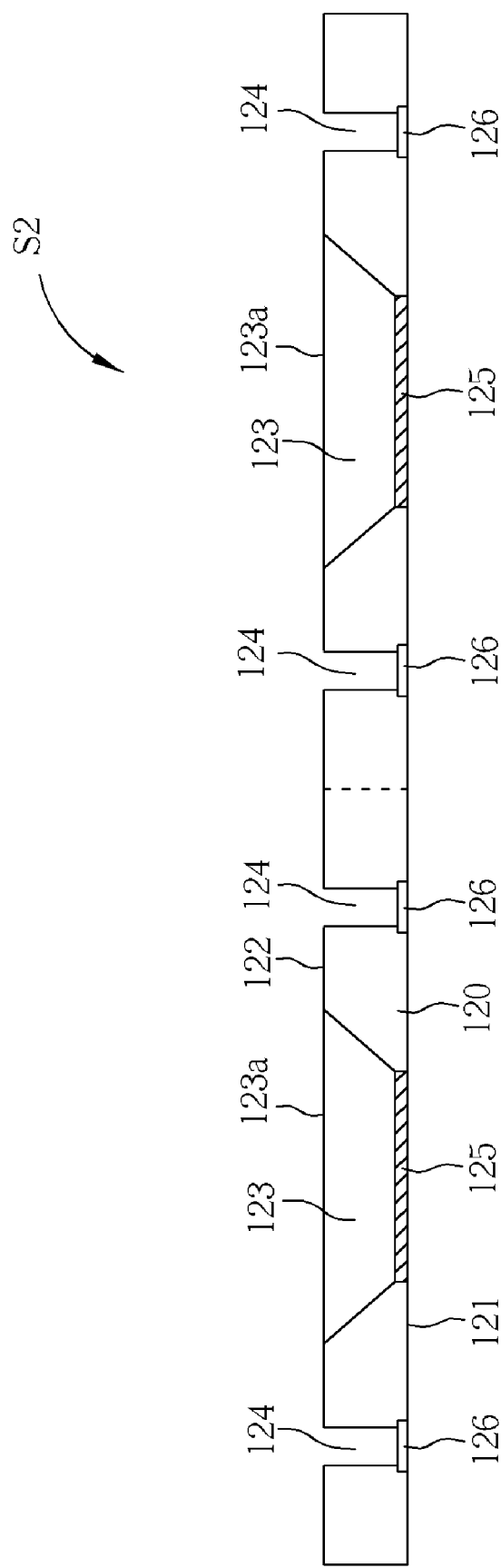

As shown in FIG. 3E, a second wafer S2 having a plurality of microphone chips 120 is provided. Each of the microphone chips 120 has an active surface 121, a back surface 122, a resonant cavity 123, a plurality of second vias 124, a vibrating film 125, and a plurality of second pads 126. The resonant cavity 123 and the second vias 124 are formed on the back surface 122 of the microphone chip 120, in which the resonant cavity 123 also has an opening 123a. The vibrating film 125 and the second pads 126 are formed on the active surface 121, in which the vibrating film 125 is disposed corresponding to the resonant cavity 123 and the second vias 124 are connected to the second pads 126. The resonant cavity 123 and the second vas 124 can be formed by an etching process. In another embodiment of the present invention, a surrounding wall 129 shown in FIG. 2 can be formed on the active surface 121 of the microphone chip 120.

Figure 3F:
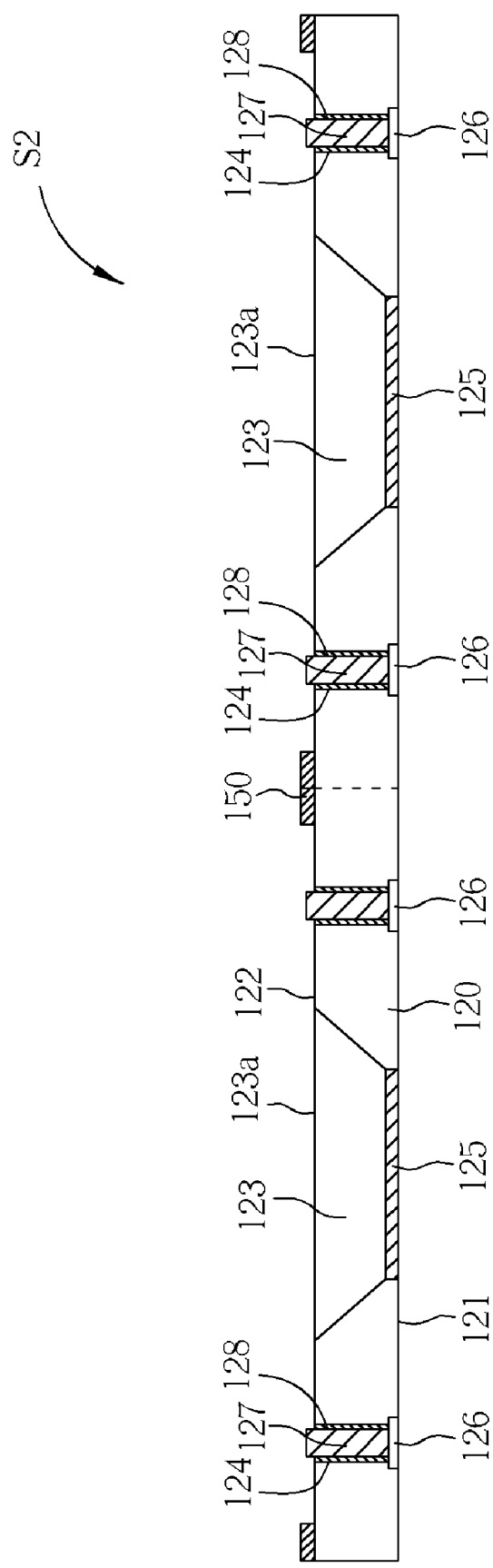
Figure 3G:
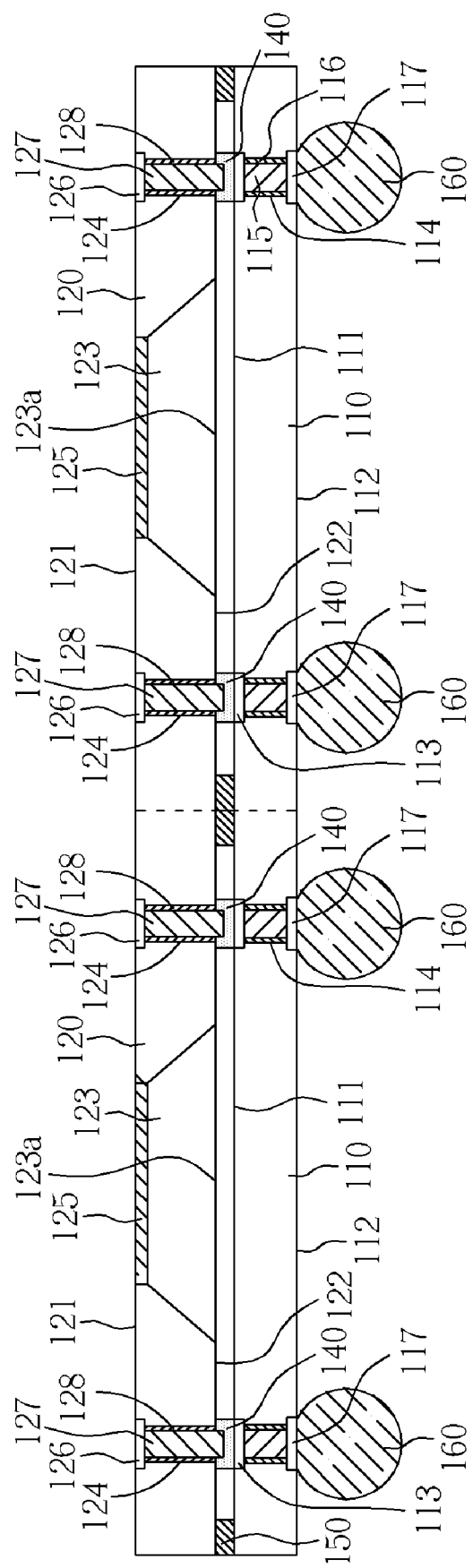

Next, as shown in FIG. 3F, a second metal 127 and a second insulator 128 are disposed into the second vias 124 of the microphone chip 120. Preferably, the second insulator 128 is disposed between the inner wall of the second vias 124 and the second metal 127, and the second metal 127 is disposed to protrude from the back surface 122 of the microphone chip 120. The second metal 127 is formed by a sputtering or electroplating process, and the second insulator 128 is formed by a chemical vapor deposition process. In this embodiment, the encapsulant 150 is formed on the back surface 122 of the microphone chip 120 and outside the second vias 124. Next, as shown in FIG. 3G, a bonding process (such as a surface bonding process) is conducted to bond the second wafer S2 to the first wafer S1. Preferably, the microphone chip 120 of the second wafer S2 is bonded corresponding to the application specific IC 110 of the first wafer S1, the opening 123a of the resonant cavity 123 of the microphone chip 120 is positioned to face toward the application specific IC 110, and the first vias 114 of the application specific IC 110 are electrically connected to the second vias 124 of the microphone chip 120.

In this embodiment, a sealing layer 140 is formed between the application specific IC 110 and the microphone chip 120 to facilitate the electrical connection between the first vias 114 and the second vias 124. The sealing layer 140 is composed of an anisotropic conductive film or an anisotropic conductive paste. Alternatively, when the microphone chip 120 and the application specific IC 140 are bonded, the sealing layer 140 can be composed of a non-conductive film or a non-conductive paste, which is also within the scope of the present invention.

Figure 3H:
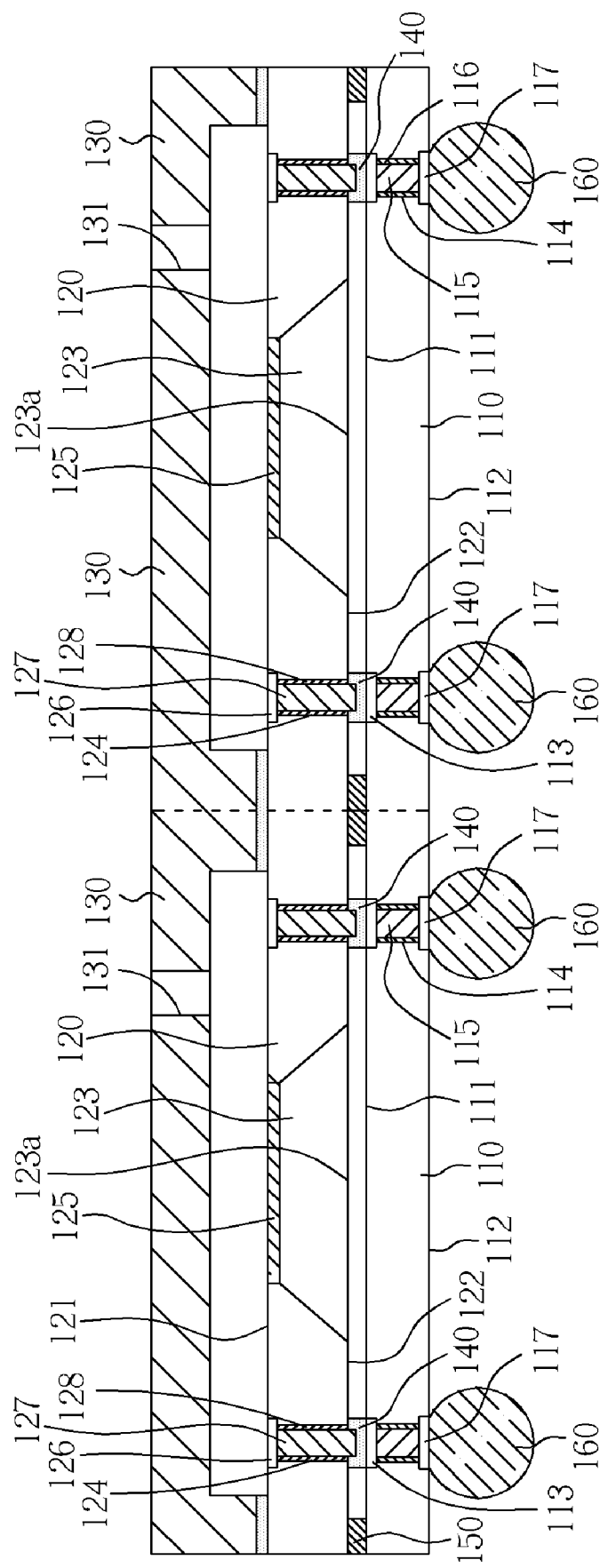
Figure 3I:
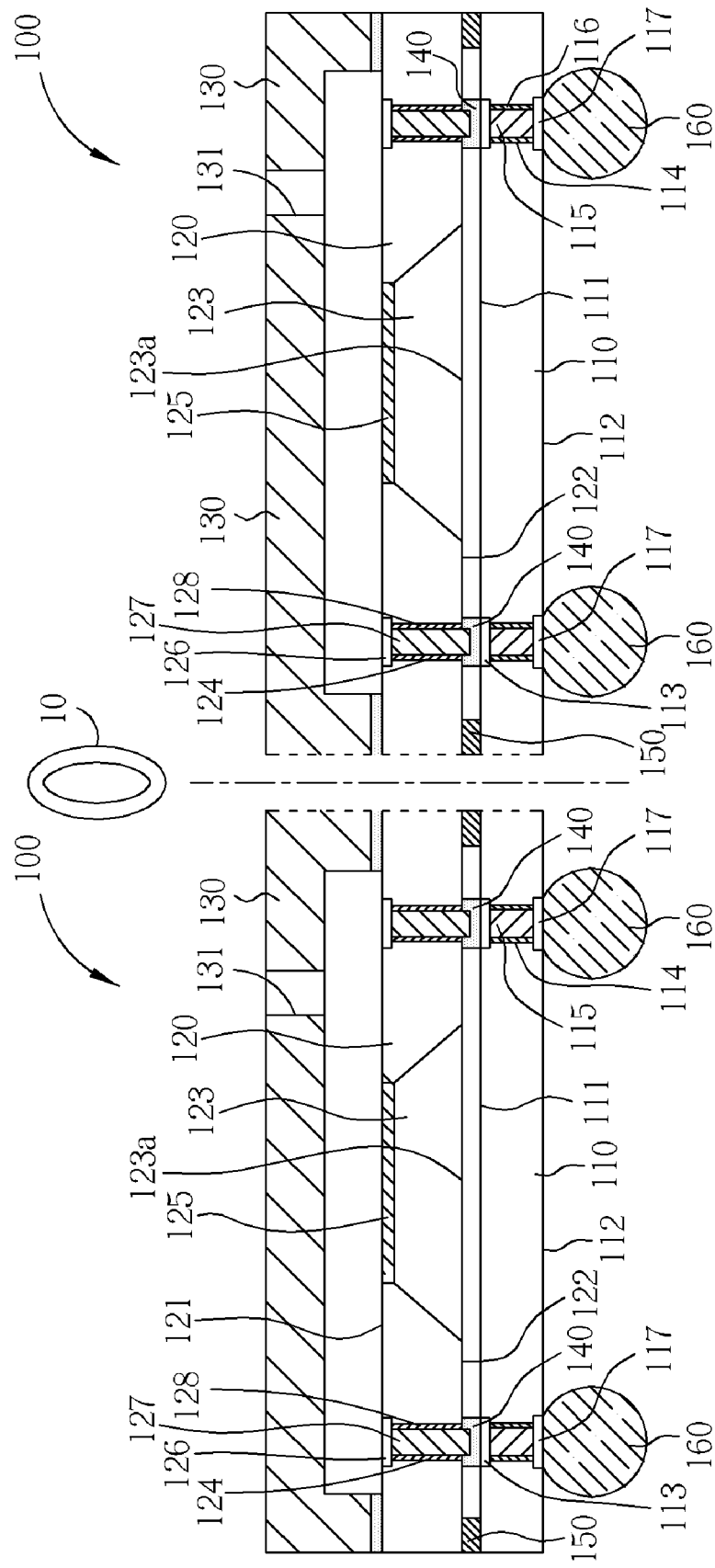

Next, as shown in FIG. 3H, a cover 130 is disposed on the active surface 121 of the microphone chip 120, in which the cover 130 includes a sound hole 131. In this embodiment, the cover 130 is fabricated with a "U" shaped cross-section. Alternatively, as shown in FIG. 2, the cover 130 can be fabricated with a "-" shaped cross-section and disposed on a surrounding wall 129. Last, as shown in FIG. 3I, a sawing process is conducted by using a sawing tool 10 to saw the first wafer S1 and the second wafer S2 to form a plurality of MEMS microphone modules 100.

Those skilled in the art will readily observe that numerous modifications and alterations of the device and method may be made while retaining the teachings of the invention.

What is claimed is:

1. A MEMS microphone module, comprising:
an application specific IC having a first surface, a second surface, a plurality of first pads, and a plurality of first vias, wherein the first pads are formed on the first surface of the application specific IC and the first vias are connected to the first pads; and
a microphone chip having an active surface, a back surface, a resonant cavity having an opening, a plurality of second vias, a vibrating film, a plurality of second pads, and a cover disposed directly on the active surface of the microphone chip,
wherein the cover comprises at least one sound hole,
wherein the vibrating film and the second pads are formed on the active surface of the microphone chip, the resonant cavity is formed on the back surface of the microphone chip, the second vias are connected to the second pads, the microphone chip is disposed on the first surface of the application specific IC with the opening of the resonant cavity facing toward the application specific IC, and the second vias of the microphone chip are electrically connected to the first vias of the application specific IC.

2. The MEMS microphone module of claim 1, wherein the microphone chip comprises a surrounding wall, wherein the cover is disposed on the surrounding wall of the microphone chip.

3. The MEMS microphone module of claim 1, further comprising a first metal formed in the first vias of the application specific IC and a second metal formed in the second vias of the microphone chip, wherein the second metal protrudes from the back surface of the microphone chip.

4. The MEMS microphone module of claim 3, wherein the application specific IC comprises a first insulator formed between the inner sidewall of the first vias and the first metal and the microphone chip comprises a second insulator formed between the inner sidewall of the second vias and the second metal.

5. The MEMS microphone module of claim 1 further comprising an encapsulant formed between the application specific IC and the microphone chip.

6. The MEMS microphone module of claim 5, wherein the encapsulant is positioned with respect to the exterior side of the first vias of the application specific IC and the second vias of the microphone chip.

7. The MEMS microphone module of claim 5, wherein the encapsulant comprises a metal material.

8. The MEMS microphone module of claim 1 further comprising a sealing layer formed between the application specific IC and the microphone chip to electrically connect the first vias and the second vias.

9. The MEMS microphone module of claim 1, wherein the application specific IC further comprises a plurality of external pads formed on the second surface of the application specific IC and connected to the first vias.

10. The MEMS microphone module of claim 1, wherein the cross-section of the cover comprises a "--" shape or a "U" shape.

* * * * *